US00RE40338E

(19) United States
(12) Reissued Patent
Biegelsen et al.

(10) Patent Number: US RE40,338 E
(45) Date of Reissued Patent: May 27, 2008

(54) TWO DIMENSIONAL OBJECT POSITION SENSOR

(75) Inventors: David K. Biegelsen, Portola Valley, CA (US); Bryan Preas, Palo Alto, CA (US); Lars Erik Swartz, Sunnyvale, CA (US); Warren B. Jackson, San Francisco, CA (US)

(73) Assignee: Xerox Corporation, Norwalk, CT (US)

(21) Appl. No.: 10/874,138
(22) Filed: Jun. 21, 2004

Related U.S. Patent Documents

Reissue of:
(64) Patent No.: 6,476,376
Issued: Nov. 5, 2002
Appl. No.: 09/683,543
Filed: Jan. 16, 2002

(51) Int. Cl.
*H01J 40/14* (2006.01)

(52) U.S. Cl. ..... 250/221; 250/214.1; 250/559.4
(58) Field of Classification Search ..... 250/221, 250/214.1, 559.4, 559.29, 559.36, 559.44, 250/559.22, 559.12, 338.1, 338.3, 338.4, 250/216, 239; 257/80–84, 431–435
See application file for complete search history.

(56) References Cited

U.S. PATENT DOCUMENTS 3,549,895 A * 12/1970 Sidorsky ..... 250/569
4,323,925 A * 4/1982 Abell et al. ..... 348/340

* cited by examiner

*Primary Examiner*—Que T Le

(57) ABSTRACT

Apparatus and method for sensing the position, size, shape and location orientation of one or more objects in two dimensions. The position sensor uses arrays of light sensors mounted on a substrate. When an object passes in proximity to the light sensors light energy from a plurality of light sources is either reflected from the object to the light sensors, or is emitted directly to the light sensors. The light energy is then converted to individual signals and transmitted through circuit traces in a printed circuit board to a local controller. The information may then be processed to determine the size, position, shape and location orientation of an object.

15 Claims, 10 Drawing Sheets

TWO DIMENSIONAL OBJECT POSITION SENSOR

Matter enclosed in heavy brackets [ ] appears in the original patent but forms no part of this reissue specification; matter printed in italics indicates the additions made by reissue.

BACKGROUND OF THE INVENTION

1. Field of Invention

This invention relates to a two-dimensional object position sensor usable to detect the position, orientation, size and/or location of an object.

2. Description of Related Art

The use of object position sensors is well known in the art. Typically, these sensors may include a light emitting diode placed in a fixed location that emits light energy in the direction of a photocell. When an object moves into the path of the light energy, the photocell ceases to send an electronic signal, thus indicating the presence of the object. Alternatively, the light emitting diode may be positioned to reflect light off of the object towards the photocell. In this arrangement, the presence of the would cause the photocell to generate an electronic signal.

In addition to these types of sensing devices, other sensing devices have been adapted for use in particular applications, such as photocopiers and printers. Typically, a sheet of paper is tracked as the sheet travels through the photocopier or printer using one-dimensional sensors or "fax bars" that detect the presence of the edge of a sheet of paper at a particular location within the photocopier or printer. These fax bars may use linear sensors arrays, which are only capable of sensing the object in one direction.

Small area imaging system such as CCD arrays and X-ray imaging systems have detector sizes on the order of 10 microns and 100 microns respectively. Due to the small pixel size and the technology that underlies the small area imaging arrays using such imaging arrays to sense the position of an object over a large area is impractical, especially when the object is in the near field of these small area imaging arrays.

SUMMARY OF THE INVENTION

Sensors usable to determine the size, position and/or location of objects are necessary in numerous operations and processes to allow for precise tracking and control of an object during the course of the process or operation. Typically, object position sensors may be placed in different locations along the path of an object undergoing a process. For instance, in an assembly line, object position sensors may be placed at various locations on the assembly line to indicate the presence of an object, such as a machine part in a manufacturing process. Object position sensors may also be used in package sorting operations involving a conveyor belt. In this type of operation, object position sensors may be placed at various locations along the conveyer belt to indicate the presence of an object, such as a box or package. In both the assembly line process and conveyor belt application, the object position sensors are used to track the progress of a box, package, or machine part through the process. This information may also be used to trigger other events within the operation or process itself.

Object position sensors are particularly applicable to photocopiers and printers to track and control the progress of a sheet of paper or other image recording medium as it progresses through the device. In conventional photocopiers and printers, a sheet of paper is tracked by a series of position sensors located at various points on a paper path within the device. In order for these position sensors to work effectively, the sheet of paper is constrained to have an edge placed along a side of the paper path, such that the object position sensor will positively register the presence of a sheet of paper. In addition, the sheet of paper may only positively be located within the paper path when it passes by one of these position sensors and is unaccounted at all other positions within the paper path. Because of this, it may often be difficult, for example, to pinpoint the exact location of a paper sheet that has become jammed in the paper path.

In such conventional photocopiers and printers, these position sensors are often only capable of sensing a sheet of paper in one dimension. A fax bar is one such device used in fax machines, copiers and printers which is capable of sensing the presence of a sheet of paper in only one dimension. While this type of sensing capability may be effective for tracking and controlling the motion of a sheet of paper in such conventional copiers and printers, the tracking and control capabilities of photocopiers and printers could benefit from providing an ability to handle a wide variety of sheet sizes and media types, multiple sheets moving together, to use center registration, and to position the sheets in arbitrary trajectories, that is, for example, by eliminating the constraint that the sheets have an edge positioned against the side of the paper path. Conventionally, if a paper path of a photocopier or printer were to be provided with such capabilities, a large number of discrete sensors would be required. While this may provide improved tracking of a sheet of paper throughout the paper path, it is an option that is currently uneconomical and impractical.

This invention provides systems and methods for sensing the size and position of an object with a two dimensional array of sensors that spans at least a portion of the path of the object.

This invention separately provides systems and methods that track an object continuously over a relatively long distance, such that the position of the object may be determined at any time while the object is in the vicinity of the array.

In various exemplary embodiments, the two-dimensional array of sensors may be fabricated inexpensively and may track an object with relatively high precision as it travels across a large area.

In various exemplary embodiments of the systems and methods according to this invention, an object position sensor uses a close-packed array of analog sensor elements, or pixels, along with appropriate illumination to determine object edge positions, and to infer object size, orientation, shape and position. In some exemplary embodiments, this is accomplished by distributing a series of light sources over the surface of a substrate such that light energy will be directed towards a series of discrete light energy detectors, or will reflect off of an object toward these discrete light energy detectors. In various exemplary embodiments, a collimating film is positioned over the light energy detectors to reduce the amount of low-angled light energy that reaches the surface of the light energy detectors. In some exemplary embodiments, a transmissive plate is positioned over the collimating film or over the analog sensor elements to allow an object to pass over the light energy detectors.

In various exemplary embodiments, the electrical signals from the sensors may then be locally digitized and hierarchically processed. In a reflective-type system, when an object, such as a sheet of paper, passes in the vicinity of the light energy detectors, light energy emitted from a light source is reflected off the surface of the object, passes through the collimating film, and is received by some of the light energy detectors. Alternatively, in a transmissive-type system, the light sources may be positioned opposite the light energy detectors. In this configuration, an object would block the light energy from reaching the light energy detectors.

In various exemplary embodiments, the sensor systems of this invention may be fabricated inexpensively using methods similar to those used to make large area solar cells or large area photoreceptor media, such as organic photoreceptor belts. These processes use roll-to-roll fabrication, which creates amorphous-Si:H photodiodes on a foil substrate, such as polyimide, or organic photoconductor or polyester. An organic photoreceptor sensor may be deposited on a substrate by a large-scale evaporation process, in the case of small molecule organics, or by a printing or coating process for polymer-based organics. In these exemplary embodiments, lateral patterning of the photosensitive material is not necessary. That is, the photo-responsive material is continuous and uniform. In this case, electron-hole pairs created by light absorbed in areas not containing collection electrodes simply recombine and do not drift to the collection electrodes. The lateral conductivity of the photosensitive material of these embodiments is low enough to essentially isolate the sensor elements.

The sensor elements of the sensor system can be arranged in arrays and have a relatively large size and/or pitch. For example, the center-to-center spacing or pitch can be sufficient to allow for sensors having a diameter of one cm in the case of a circular sensor element. Through the use of arrays, the position sensing resolution of the sensor systems and methods of this invention are considerably finer than the size and pitch of the sensor elements themselves. In this way, large areas may be covered by arrays of analog sensor elements to determine the position and size of an object in proximity to the array.

For instance, in a photocopier, these two-dimensional arrays of sensor elements may extend over the entire paper path, such that a sheet of paper can be continuously and accurately tracked throughout the entire process, including around the curves and bends of the paper path. Further, because the size and shape of the object may be determined through the use of the array of sensor elements, processes may be adapted to handle a wide variety of object sizes. For instance, the sensor systems and methods of this invention could be used in a photocopier to determine a variety of sheet sizes and media types, to determine if multiple sheets are moving together, to use center registration and to determine the position of a sheet of paper such that the photocopier may make adjustments or reposition the sheet of paper based on the information received from the position sensors.

These and other features and advantages of this invention are described in or are apparent from the following detailed description of the preferred embodiments.

BRIEF DESCRIPTION OF THE DRAWINGS

Various exemplary embodiments of the invention will be described with reference to the accompanied drawings, in which like elements are labeled with like numbers and in which.

DETAILED DESCRIPTION OF EXEMPLARY EMBODIMENTS

Figure 1:
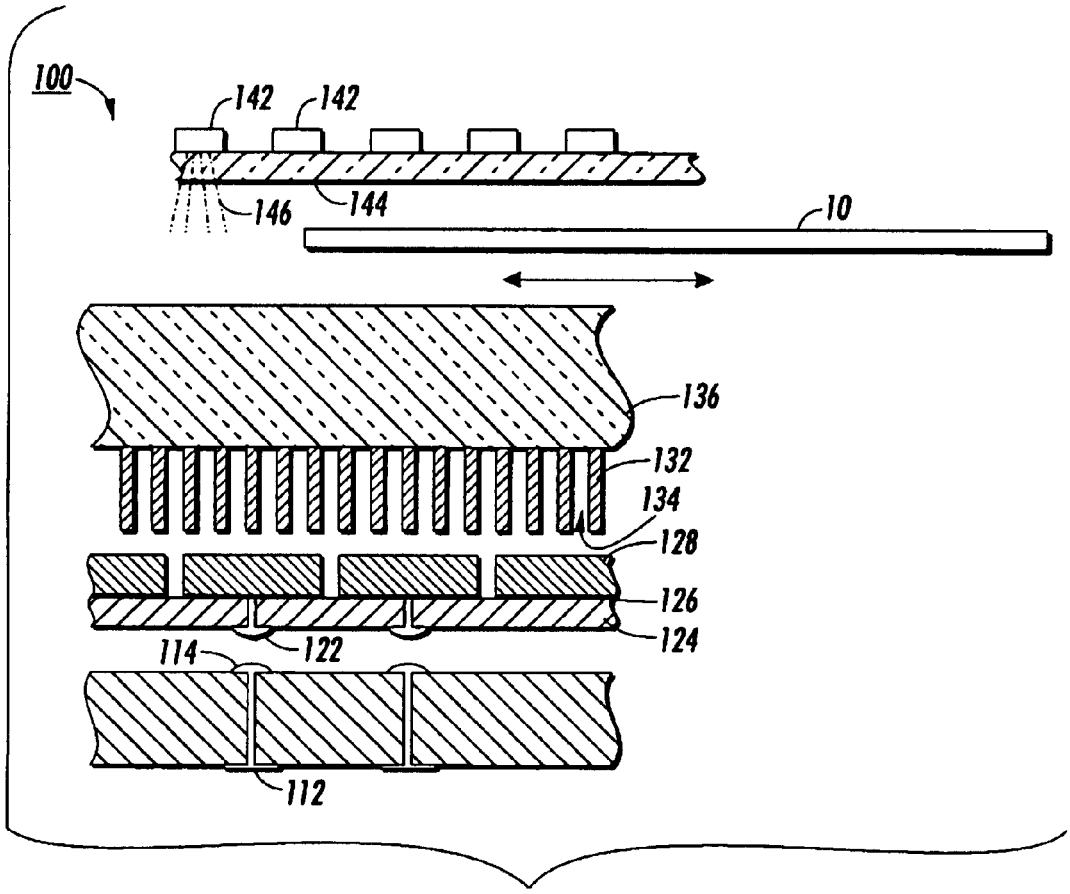
FIG. 1 shows a first exemplary embodiment of an object position sensor according to this invention, having a series of light emitters located opposite the light energy detectors.

FIG. 1 shows a first exemplary embodiment of a large area object position sensor 100 according to this invention. As shown in FIG. 1 the large area object position sensor 100 includes a number of light sources 142 mounted on a transmissive plate 144. The light sources 142 emit light energy 146 towards a transmissive plate 136. An object 10 passing between the transmissive plate 144 and the transmissive plate 136 will block the light energy 146 from reaching the transmissive plate 136. The light source 142 may be any known or later-developed type of light emitting device, including, but not limited to, infrared light emitting diodes, light emitting diodes, or ordinary light bulbs. As shown in FIG. 1, the transmissive plate 144 may be formed from a rigid material and thus may act as a substrate for mounting the light sources 142. Both the transmissive plate 136 and the transmissive plate 144 may be formed of plastic and/or glass materials and may be rigid or flexible. The object 10 may be a piece of paper, cardboard, semiconductor wafer, or any other object desired that is capable of blocking the path of the light energy 146 from the light sources 142.

Those portions of the light energy 146 that are not obscured by the object 10 will pass uninterrupted through the transmissive plate 136 to a collimating film 132. The collimating film 132 channels light energy 146 through a collimated light path 134 onto a light energy detector 128. Light rays traveling within an acceptance cone of the high aspect ratio holes in the collimating film are able to reach a sensor 128, whereas light rays traveling at lower angles are absorbed by the collimating film. The light sensors 128 may be solar cells, photoreceptors, or any other known or later-developed device, apparatus, structure or system that will extend over a sufficiently large area, such as 1 cm diameter circle, and that is capable of transforming light energy into electrical signals. The collimating film 132 may be a paper material, a plastic material or any other appropriate material having the desired light absorbing qualities. The collimating film 132 screens out ambient light and low-angled portions of the light energy 146 that did not emanate directly from the light sources 142. It should also be appreciated that the light sources 142 may be implemented by using ambient light channeled toward the transmissive plate 144 through a second collimating film or other such light channeling device to achieve the desired effect.

The light energy detectors, or light sensors, 128 may be one or more of any number of different types of light sensing devices. In the exemplary embodiment illustrated in FIG. 1, the light sensors 128 are solar cells that are mounted in an array pattern on a substrate 124. The light sensors 128 convert the light energy 146 received from the light source 142 into electrical signals. These electrical signals are transmitted through an upper circuit path 126 to an upper solder bump 122. The substrate 124 is electrically connected to a printed circuit board 110 having lower solder bumps 114. As illustrated in FIG. 1, the electrical signals continue through the lower solder bumps 114 to a lower circuit path 112. In various other exemplary embodiments, the light sensors. 128 may be mounted onto a printed circuit board, thus removing the need for the substrate 124, and the solder bumps 122 and 114.

In the large area object position sensor 100 shown in FIG. 1, the absence of the object 10 will be indicated by analog electrical signals generated by the light sensors 128. The combination of electrical signals generated from a number of the light sensors 128 may be locally or centrally processed. Locally processed signals may then be processed hierarchically. In either manner, the size, shape, orientation, position and/or location of the object 10 relative to the sensors 128 of the large area object position sensor 100 may be determined with a high degree of accuracy that allows the position of the object 10 relative to the light sensors 128 to be determined to a finer resolution than the pitch or the size of the light sensors 128. This is described below in greater detail.

Figure 2:
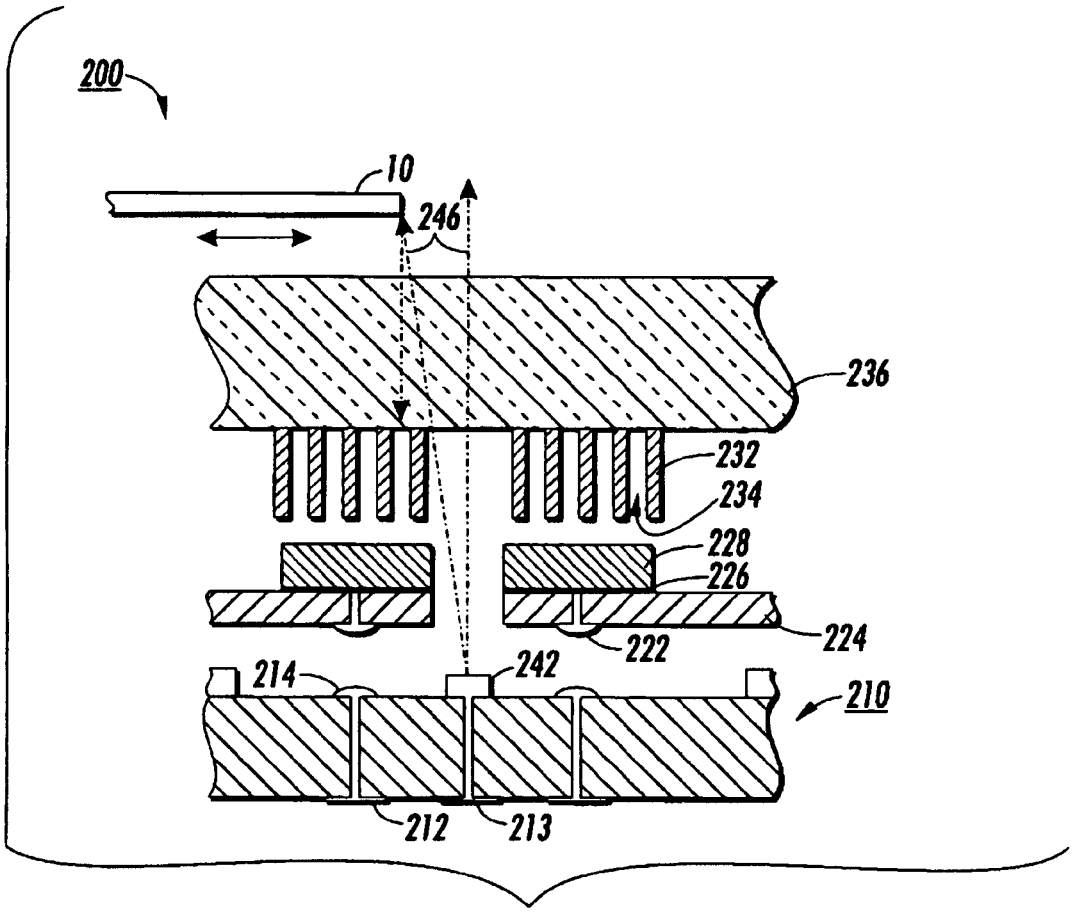
FIG. 2 is a second exemplary embodiment of the object position sensor according to this invention having the light emitters located adjacent to the light energy detectors.

FIG. 2 shows a second exemplary embodiment of a large area object position sensor 200 according to this invention. In contrast to the large area object position sensor 100, the object position sensor 200 includes a number of light sources 242 that are located directly on a printed circuit board 210 having circuit paths 213. The light sources 242 emit light energy 246, which passes through a window 229 formed in the substrate 224. The light energy 246 then passes through a window 233 formed in a collimating film 232 and through a transmissive plate 236 to illuminate the object 10. The object 10 passing over the light sources 242 reflectively scatters the light energy 246 back through the transmissive plate 236 toward the collimating film 232.

The collimating film 232 then channels those rays of light 246 traveling nearly parallel to the high aspect holes in the collimating film through a number of collimated light paths 234 onto a number of light sensors 228. Light rays incident at lower angles are absorbed by the collimating film and do not arrive at a light sensor 228. As in the large area object position sensor 100, the transmissive plate 236 may be formed of a rigid or flexible material, such as glass or plastic. The collimating film 232 may be of paper or plastic having a light absorptive surface. Similarly to the collimating film 132 of the large area object position sensor 100, the collimating film 232 functions to screen out ambient or lower-angle light energy that is not scattered in a nearly vertical direction from the object 10 passing over the light source 242.

It should be appreciated that, in various exemplary embodiments, the collimating film can be omitted. However, if the collimating film is omitted, the light reflected from or passing by the object from the light source must be sufficiently oriented relative to the large area positions sensor so that the position of the object can be accurately determined. As outlined above, if light reflected from the object impinges on multiple sensors, or if light from the light source reaches sensors that should be eclipsed by the object, the accuracy of the signals from the sensors is reduced.

If the collimating film is omitted, one or more light sources having optics that collimate the light before it is blocked or passed by a transmissive system can be used. In fact, if the one or more light source is located sufficiently distant from the object, the collimating optics may be omitted as well. Alternatively, in a reflective system, collimating optics or other collimating elements can be used in place of the collimating film. Moreover, if the reflective properties of the object to be sensed are sufficiently known in advance, the uncollimated light reflected from that object can be used to illuminate multiple light sensors, with the information about the reflective properties used during processes to accurately determine the position of the object relative to these sensors.

The light sensors 228 generate electrical signals that travel through upper circuit paths 226 to upper solder bumps 222. The upper circuit paths 226 are mounted on a substrate 224. The electrical signals travel through lower solder bumps 214 mounted on printed circuit board 210 and lower circuit paths 212 formed on the printed circuit board 210. The light sensors 228 may be solar cells, photoreceptors, or any other known or later-developed device, apparatus, structure or system that will extend over a sufficiently large area, such as a 1 cm diameter circle, and that is capable of transforming light energy into electrical signals. In various other exemplary embodiments, the light sensor 228 may be mounted on the printed circuit board 210, thus eliminating the need for the substrate 224 and the solder bumps 222 and 214. As in the large area object position sensor 100, the electrical signals generated by the light sensors 228 may be processed to derive shape, position and/or orientation of the object. In contrast to the large area object position sensor 100, the large area object position sensor as shown in FIG. 2 generates electrical signals only when the object 10 passes in proximity to the light sensors 228.

Figure 3:
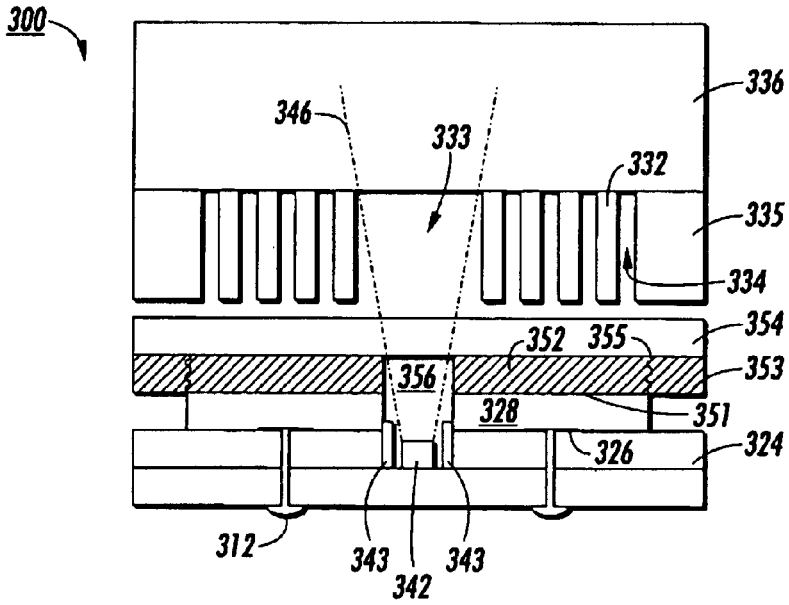
FIG. 3 is a third exemplary embodiment of the object position sensor according to this invention, using a photoreceptor sheet as the light energy detector.

FIG. 3 shows a third exemplary embodiment of a large area object position sensor 300 according to this invention. In this embodiment, light energy 346 is emitted by a number of light sources 342 upward through a window 356 formed in an unpatterned photoreceptor 350. The light energy 346 then passes through a window 333 formed in a collimating film 332 and through a transmissive plate 336. The 10 passing in proximity to one of the light sources 342 will cause the light energy 346 to reflectively scatter back through the transmissive plate 336 to the collimating film 332. The rays of the light energy 346 that transmit through the collimating film 332 without being absorbed will be channeled through one or another of a number of collimated light paths 334 onto a transparent sheet 354 and transparent electrode 355. The light energy passes through the transparent electrode 355 and into a light sensitive portion 352 of the unpatterned photoreceptor 350.

As shown in FIG. 3, each of the light sensor portions 352 of the unpatterned photoreceptor 350 allows photogenerated current to pass from the transparent electrode 355 to the opposite electrode 351 through photoreceptor 350 in response to the photo-conductivity that occurs in illuminated regions 352 of the photoreceptor 350 in response to any received light energy 346. In particular, the current that passes through the illuminated portion 352 to the electrodes 351 is conducted via conducting adhesive portions 328 to corresponding circuit paths 326. The conductive adhesive 328 portions are mounted directly on a printed circuit board 324 that carries the circuit paths 326. The current paths 326 transmit the electrical signals to corresponding solder bumps 312. The electrical signals then travel on to be locally processed and then hierarchically processed.

Additionally, the dark conductivity of the photoreceptor 350 in non-illuminated areas 353 is sufficiently low that the light sensor portions 352 of the photoreceptor 350 are essentially electrically isolated from each other by these non-illuminated portions 353. The non-illuminated portions 353 are created by blocking portions 335 of the collimating film 332.

Because the third exemplary embodiment of the large area object position sensor 300 uses the light sensor portions 352 of the unpatterned photoreceptor 350 to create the electrical signals on the circuit path 326, light shields 343 are placed adjacent to the light sources 342. The light shields 343 prevent light emitted from the light sources 342 from directly shining onto the light sensor portions 352 and thus generating false electrical signals which would have to be subtracted from the total to ascertain that due to the object alone. The light shields 343 can be formed by opaque mylar disks surrounding the light sources 342. Alternatively, the sidewalls of the light sources 342 can be made non-emissive by coating with an opaque potting material or paint. In still other alternatives, the Light Sources 342 may be elevated so that the light emitting areas are well above the level of the photoreceptor sheet 352 and hidden by the collimating film 332. In general any appropriate technique can be used to ensure the light sources 342 do not emit directly onto the light sensor portions 352.

Figure 4:
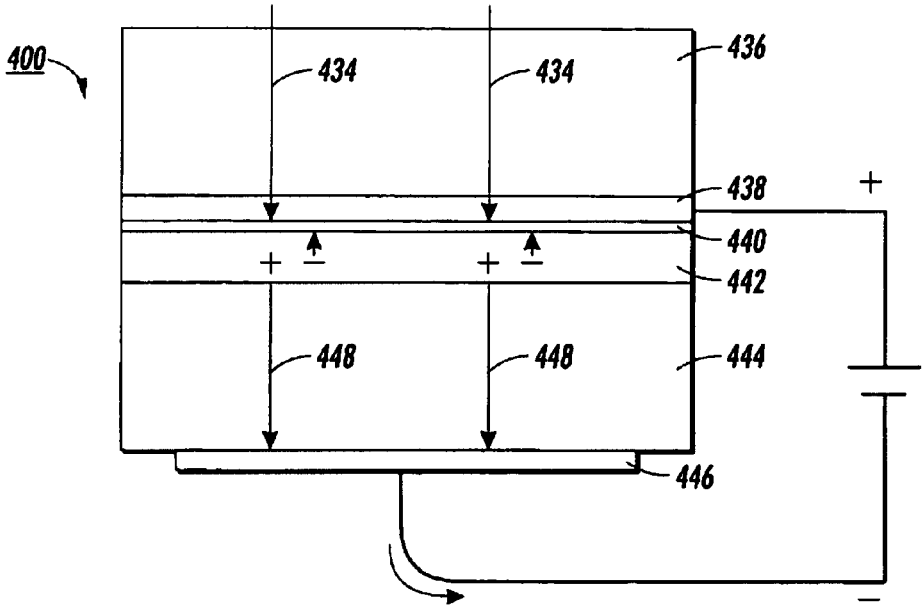
FIG. 4 is an exemplary embodiment of a photoreceptor-based light detector according to this invention.

FIG. 4 is an exemplary embodiment of an unpatterned photoreceptor 400 usable as the photoreceptor 350 described above. As shown in FIG. 4, light energy 434 reflectively scattering from an object or emanating directly from a light source passes through a transmissive plate 436 mounted adjacent to a transmissive or transparent electrode 438. The transparent electrode 438 may be formed of indium tin oxide, TiZr alloys, nickel, aluminum, polyanaline, or other thin, nearly transparent metallic materials. In general, the transmissive or transparent electrode 438 can be made of any material that allows sufficient incident photons through to the hole blocking layer 440 to allow the object to be sensed. A hole blocking layer 440, such as polysilane, is interposed between the transmissive or transparent electrode 438 and a photo-generation layer 442 such as hydroxy gallium phthalocyanine. The holes 448 generated by the photo-generation layer 442 passes through a hole transport layer 444. A contact 446 is electrically connected to the hole transport layer 444. The contact 446 may be made of gold or any other suitably conductive material. The contact 446 may be formed by sputtering through a shadow mask, photo lithography or any other suitable technique. The holes 448 are conducted through the contact 446 and travel to the signal processing circuits 320 described above via a conducting adhesive layer 328. It should be appreciated that, in various exemplary embodiments a bias field can be applied between the electrodes. Applying a bias field leads to obtaining much higher signals and much faster response times. In various exemplary embodiments, this bias held is on the order of approximately 30V/micron.

Figure 5:
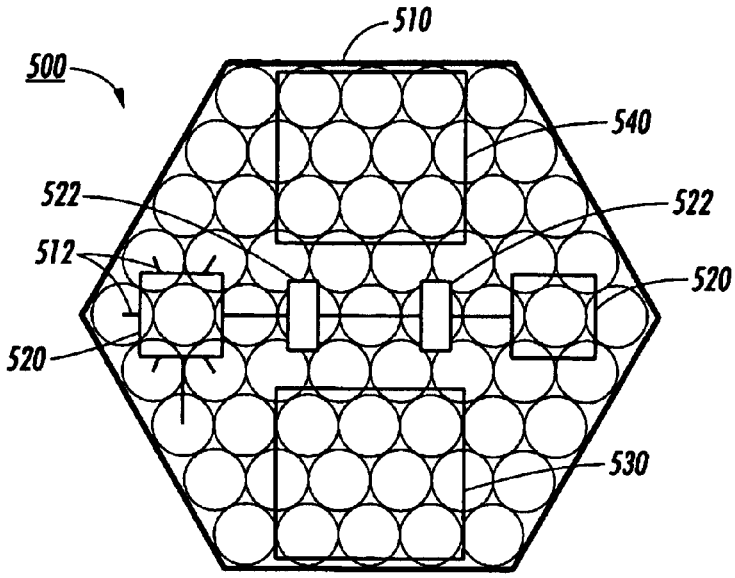
FIG. 5 is a top plan view of a first exemplary embodiment of an array of the object position sensors usable in any of the exemplary embodiments shown in any of FIGS. 1-3.

FIG. 5 shows one exemplary embodiment of a hexagonal tile portion 500 of one of the large object position sensors 100-300 containing an array 510 of the light sensors 128, 228 or 252. Signals generated from each of the light sensors 128, 228 or 352 of the array 510 are transmitted to one of a pair of signal processing circuits 520 over a corresponding signal line 512. Each of the signal processing circuits 520 transmit signals to a second signal processing circuit 522. The two sets of signal processing circuits 520 and 522 input analog light intensity values transmitted from light sensors 128, 228 or 352 of the array 510 and convert the analog light intensity signals into digital signals for further processing. These digital signals may then be processed in a local control circuit 530 having a memory 540. The local control circuit 530 is in turn connected to one or more higher level control circuits that combine the signals from a number of the tiles 500 to determine an object's position, size and/or orientation. The local control circuits 530 and the signal processing circuits 522 and 520 may be mounted on the printed circuit board 110, 210 or 310. In general, the signal lines 512 are directed to the circuit paths 112, 212 or 312.

It should be appreciated that, in various exemplary embodiments, the arrays of the large-area light sensors according to this invention can be laid out in specific ways, depending on the application, to reduce the total area of coverage. This can allow other elements, such as motors or air jets, to be integrated into the array. Alternatively, this can be done simply to reduce the cost by reducing the number of light sensors and therefore the cost of any needed ancillary electronics. As long as the open regions between the individual large area light sensors are smaller than the smallest object to be sensed, such sparse arrays can still be used to span large areas and to provide 3-degree-of freedom feedback that is continuous in space and time.

The area of the individual large-area light sensors may be varied to trade off resolution and number of signals. Thus, in the areas of a paper path of a photocopier, printer, or in any other device incorporating the large area sensor systems according to this invention, where low resolution may be acceptable but continuous feedback is still desired, larger light sensors, still close-packed, may be used. For instance, some light sensors may be as small as about 1 mm in diameter. While sensors smaller than 1 mm in diameter may be used in particular applications, there is no upper boundary on the size of the sensor. In regions in any other device incorporating the large area sensor systems according to this invention, where high resolution is needed, small light sensors may be used.

In various exemplary embodiments, the arrays of individual large area light sensors and any needed ancillary electronics according to this invention may be formed into arbitrarily-shaped layouts. For example, "tic-tac-toe-shaped" arrays can be laid out which can give similarly high resolution, continuous feedback using fewer of the large-area light sensors and related electronics, thus reducing costs. In this case, the smallest sensible object will be no smaller than the spacing between rows and/or columns of pixels. In another exemplary embodiment, parallel columns of light sensors can be placed along the process direction of an object. The position and/or the skew of multiple objects could be sensed continuously. By adding cross rows, more complete shape information can be derived.

It should also be appreciated that, in various exemplary embodiments, the large-area light sensor systems according to this invention can use a flexible substrate. In this case, the object can be located with 3 degrees of freedom, such as x, y and θ, relative to the flexible substrate. However, to the extent that the substrate is curved through space, the sensed object could also be detected through 3 dimensions. A flexible substrate would be particularly desirable for sensing flexible objects, such as paper sheets in a paper path. Because the flexible substrate may be curved, objects can be sensed as the objects move along curved paths. Therefore, the flexible substrate may be used in cases where the path of the object or the geometry changes over time. It should further be appreciated that the light weight and large area of the substrate also enables the detector to be used on walls or tables to track human-scale objects over human-scale distances. In this way people, baggage, or relatively large objects may be tracked with the large-area light sensor system according to this invention.

Figure 6:
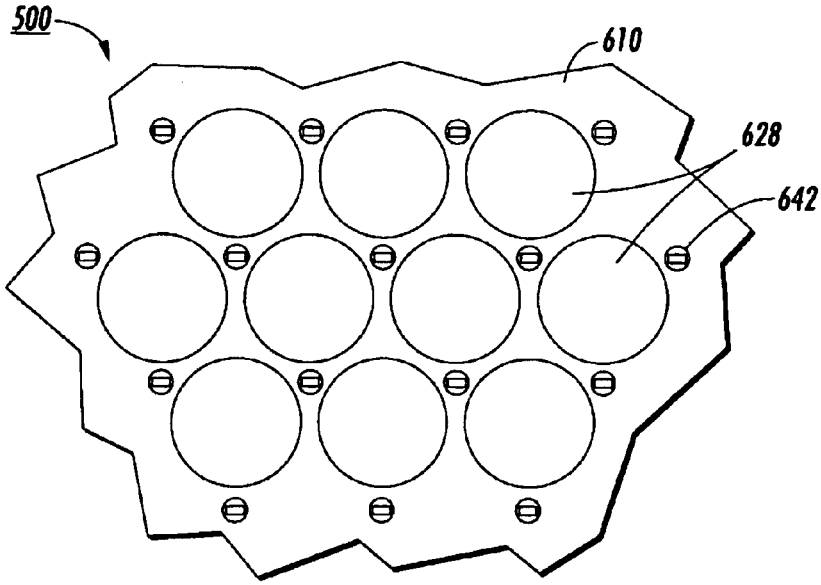
FIG. 6 is a top plan view of a second exemplary embodiment of an array of object position sensors according to this invention, having light sources located between the sensors.

FIG. 6 shows another exemplary embodiment of a portion 610 of a large area object position sensor 600 of this invention. As shown in FIG. 6, the portion 610 includes a number of individual light sensors 628. The light sensors 628 can be implemented using any of the light sensors 128, 228 or 352. The portion 610 also includes a number of light sources 642 that are positioned between the light sensors 628. In this configuration, an object passing in proximity to the light sensors 628 can reflect light energy from the light sources 642 back towards the light sensors 628. Electrical signals generated by the light sensors 628 are then processed to determine the size, position and location of the object that generated those signals as described above.

The large object position sensor 600 illustrated in FIG. 6 is particularly useful in printers, fax machines or photocopiers. The large area object position sensor 600 can be placed continuously along the paper path of such a device. Because the light sources 642 are located on the same side as, and adjacent to, the light sensors 628, the opposite side of the paper path may accommodate various actuators and manipulators for moving a sheet of paper or other image recording media along a paper path, as well as adjusting or manipulating the position of the sheet. More generally, areas of the position sensor 600 can be removed to allow actuators to address the paper from the sensor side. The geometry of the resultant sensing array is programmed into the computational processor to account for blind spots.

Figure 7:
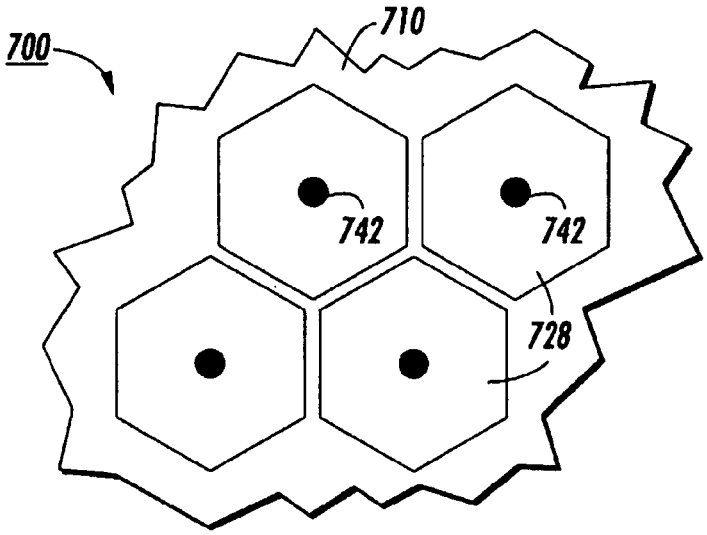
FIG. 7 is a top plan view of a third exemplary embodiment of an array of object position sensors according to this invention, having a hexagonal shape and light sources located in the centers of the sensors.

FIG. 7 shows another exemplary embodiment of a portion 710 of a large area object position sensor 700 according to this invention. As shown in FIG. 7, a number of hexagonal light sensors 728 each has a corresponding light source 742 located in the center at the light sensor 728. The light sensors 728 can be implemented using any of the light sensors 128, 228 or 352 shown in FIG. 1-3. In contrast to the large area object position sensor as shown in FIG. 6, the large area object position sensor 700 has a single dedicated light source 742 for each light sensor 728. Due to their shape, the hexagonal light sensors 728 can be provided as a very dense closely packed array. This allows the amount of dead space between the light sensors 728 to be reduced relative to that of a hexagonal close packing of circles, thus increasing the precision with which an object may be tracked.

Figure 8:
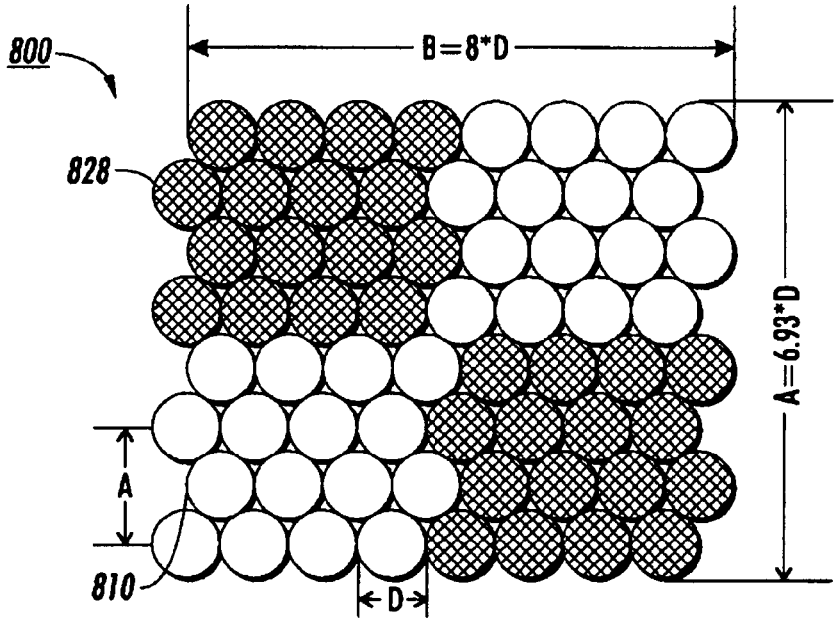
FIG. 8 illustrates an array of object position sensors according to this invention.

FIG. 8 shows an exemplary embodiment of a large area object sensor 800 having an array of light sensors 828. The light sensors 828 can be implemented using any of the light sensors 128, 228, or 352, and any of the structures for the light sensors shown in FIGS. 6 and 7. The array can be divided into separate cells 810 having a length B and a width A. The length B is a function of the diameter D of a single light sensor 828. The width A is also a function of the diameter D. The dimensions described in the cells 810 are used to determine the size, position and location of an object with a high degree of accuracy. The tiling as represented in FIG. 8 contains a rectangular array of 64 pixels 828. This can be compared with the hexagonal tile shown in FIG. 4. A hexagonal close packed array of pixels with 5 pixels along an edge would contain 61 pixels per tile. Since most electronic chips are designed to handle powers of two, tilings with 64 elements are relatively more desirable. Furthermore, for many sensing systems a rectangular spatial covering is more usual. While FIG. 8 shows a rectangular array, it should be appreciated that the tiles may be formed in any desired arbitrary shape.

Figure 9:
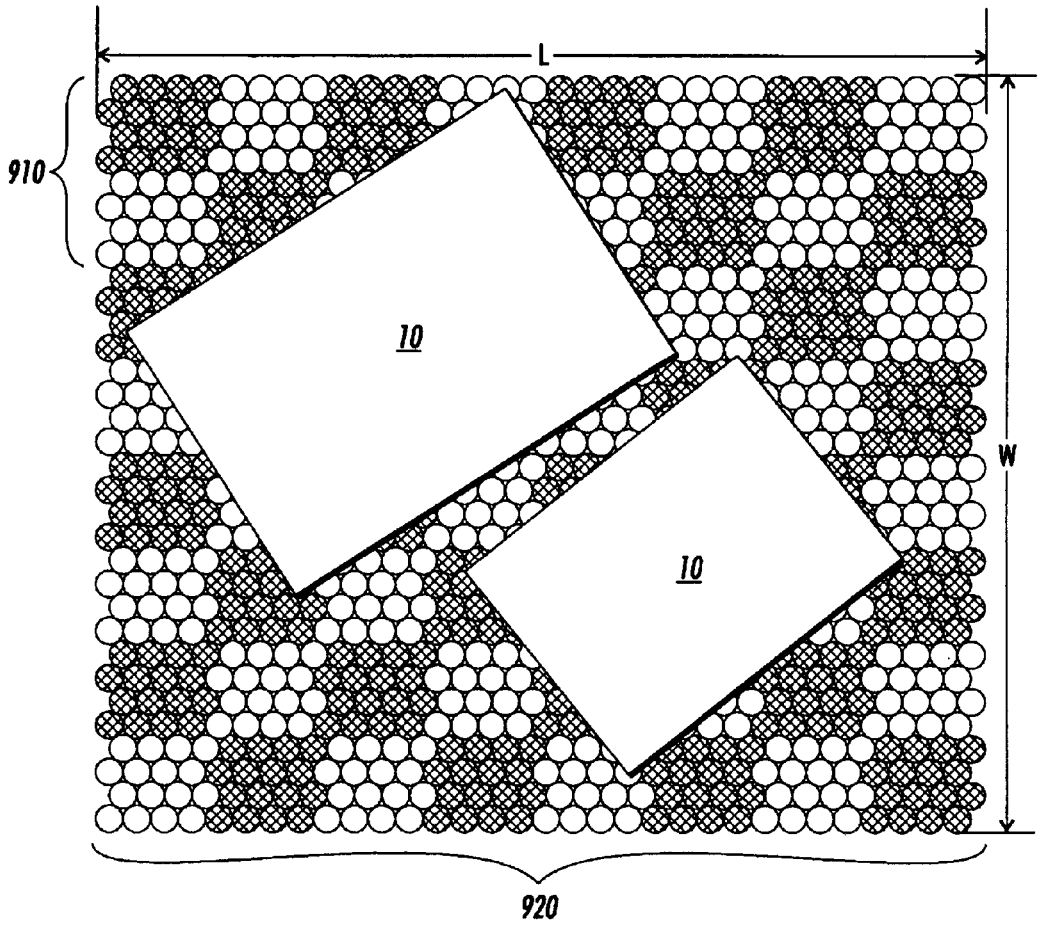
FIG. 9 is an exemplary embodiment of an array of object position sensors according to this invention, that is located in a paper path of a photocopier, with two sheets of paper passing over the array.

FIG. 9 shows an exemplary embodiment of one of the large area object position sensors 100-800 according to this invention having the array 820 of the cells 810 of the light sensor 828. The array 820 has a length of L and a width of W and can be formed by aggregating a number of the tiles 400 or 800, or as a single large untiled structure.

Figure 10:
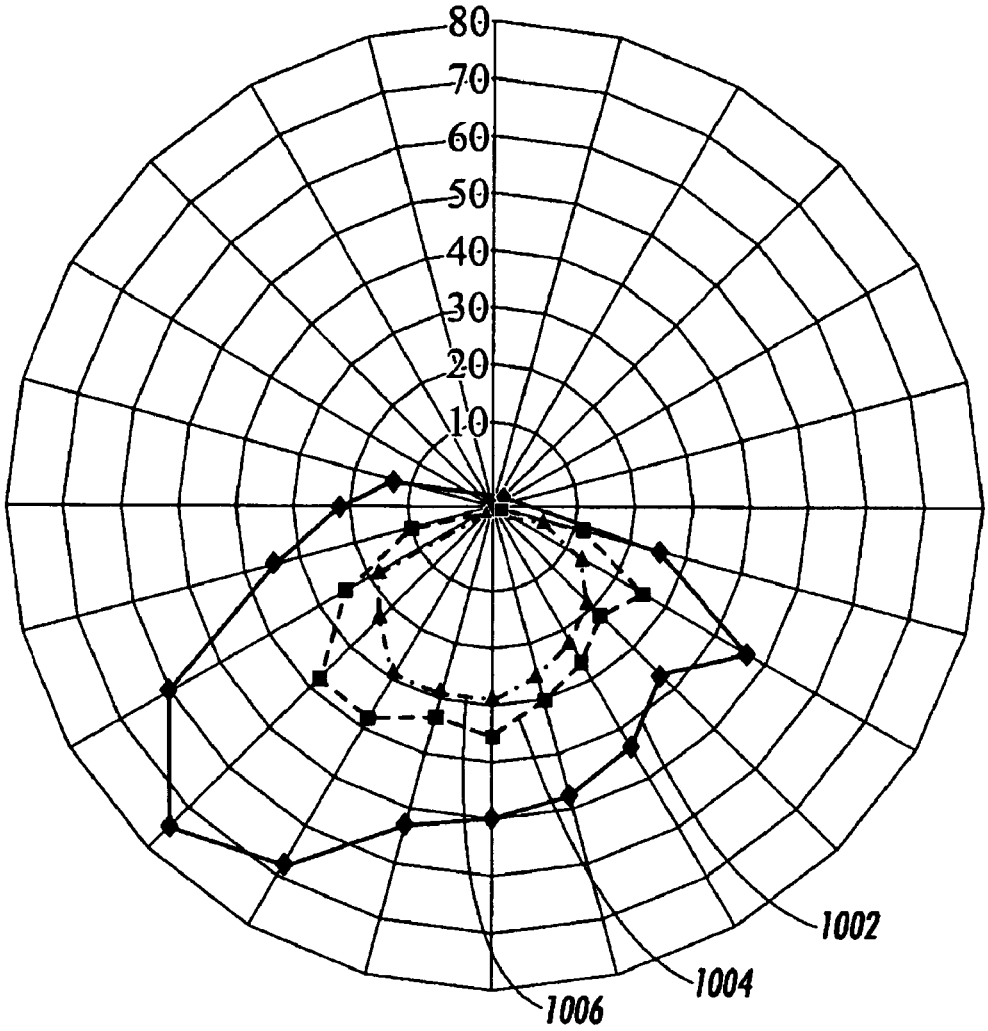
FIG. 10 is a graphical illustration of the measured light intensity of a light emitting diode of this invention having varied surface conditioner.

FIG. 10 is a graphical illustration of the light intensity of a light emitter of this invention having various types of diffusing surfaces. The light intensity is graphically represented in polar coordinates. In various exemplary embodiments, the light emitting diodes of this invention have a lambertian surface, i.e., a surface appearing equally bright regardless of the angular aspect from which it is viewed. This is advantageous because equal distribution of the light energy over the light energy detectors ensures a uniform measured response, rather than a disproportionate response that is based on the angle of the light energy detector in relation to the light emitter.

The curve 1002 is a representation of the light intensity of a light emitter having a bare surface, or no diffusing characteristic at all. As illustrated by the curve 1002, light intensity values vary significantly in accordance with the angular aspect from which the light source is viewed. The curve 1004 is a graphical representation of a light emitter of this invention having the sides of the emitter painted in order to prevent light energy from being emitted in a lateral direction. As evident from the graph, a light emitter with painted side surfaces illustrates characteristics that are closer to a lambertian surface than the characteristics exhibited by the light emitter having the curve 1002. The curve 1006 is a graphical representation of the light emitter of this invention having a frosted surface. A light emitter having a frosted surface or a milky scattering encapsulation for the diffusion of light has the desired effect of a lambertian emitter. This is evident by the nearly circular shape of the curve 1106.

Figure 11:
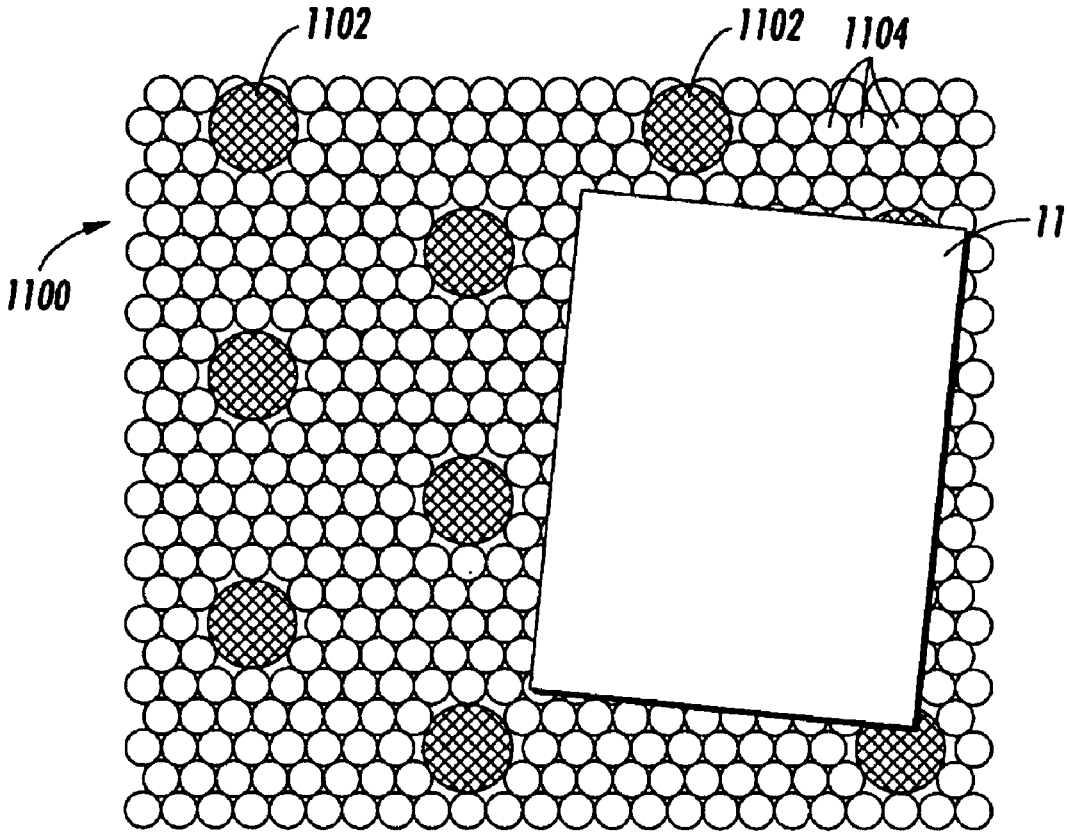
FIG. 11 illustrates one exemplary embodiment of an array of object position sensors according to this invention located in a paper path of a photocopier, having a plurality of actuators located on the same side as the object position sensors for manipulating a sheet of paper.

FIG. 11 illustrates an exemplary embodiment of an array 1100 of object sensors 1104 of this invention usable in a photocopier or printer. In this embodiment, a number of actuators 1102 are located on the same side as the position sensors 1104. As such, a sheet of paper 11 passing over the object position sensors 1104 may be manipulated by one or more of the actuators 1102 based on process data received from the object position sensors 1104. Because the actuators 1102 are located on the same side as the object position sensors 1104, the limited space inside a photocopier or printer may be used more efficiently. For instance, the array 1100 could be placed in the paper path of a photocopier or printer, such that a sheet of paper may be both tracked and manipulated while utilizing only one side of the paper path. This frees up the other side of the paper path for various other operations that can be performed on the sheet 11 during printing or photocopying.

Figure 12:
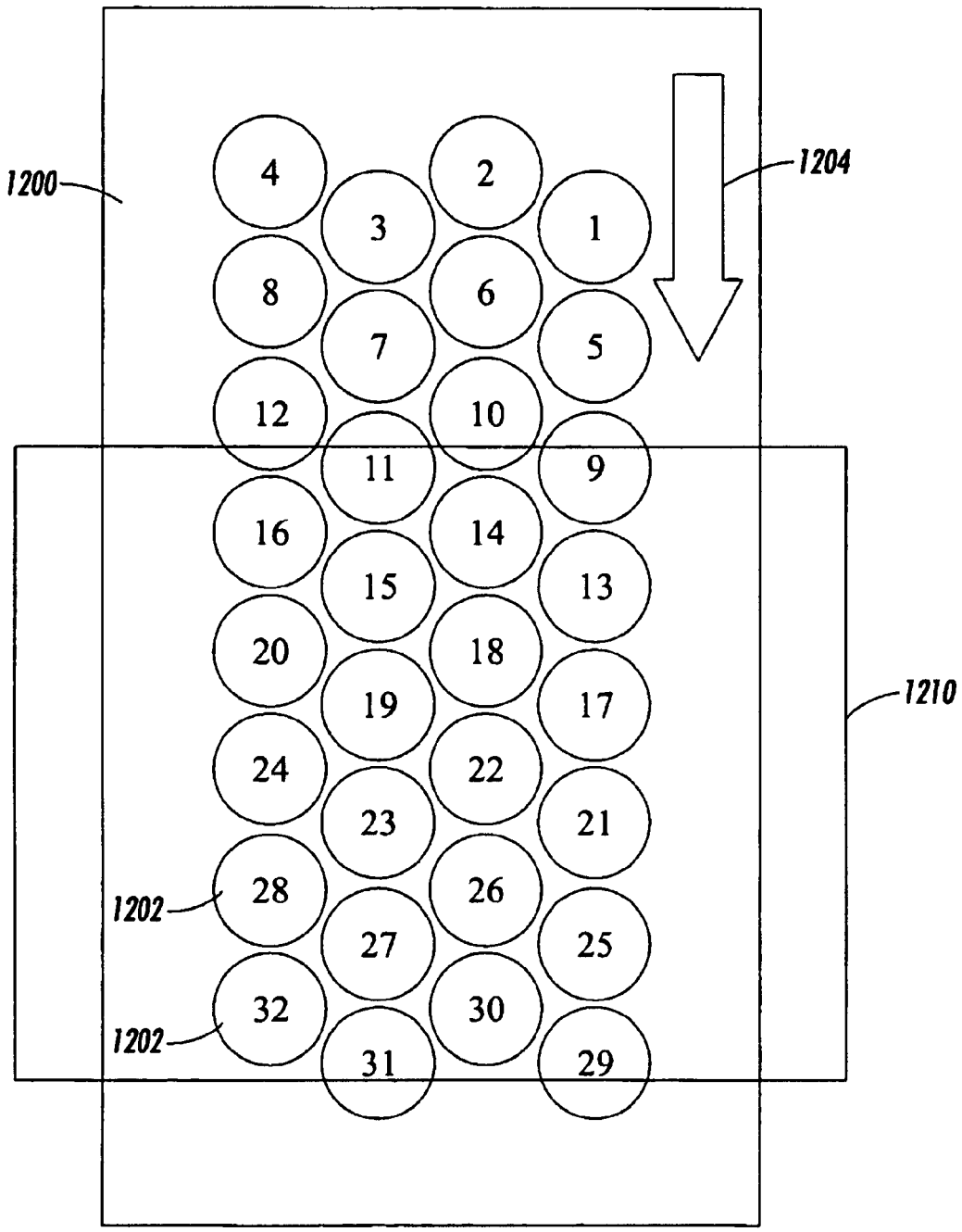
FIG. 12 is an exemplary embodiment of an array of numbered object position sensors showing the direction of travel of an object passing in the proximity of the sensors.

FIG. 12 is an exemplary embodiment of an array 1200 having 32 light energy sensors 1202 identified to allow the location of an object to be coordinated based on the output from the sensors 1202. Outputs from the sensors 1202 will vary based on the location of an object to be sensed, such as, for example, as a function of the area of sensor covered by object. The arrow 1204 indicates the direction of travel of a sheet 11, with straight edges perpendicular to the direction of motion, traveling over the array.

Figure 13:
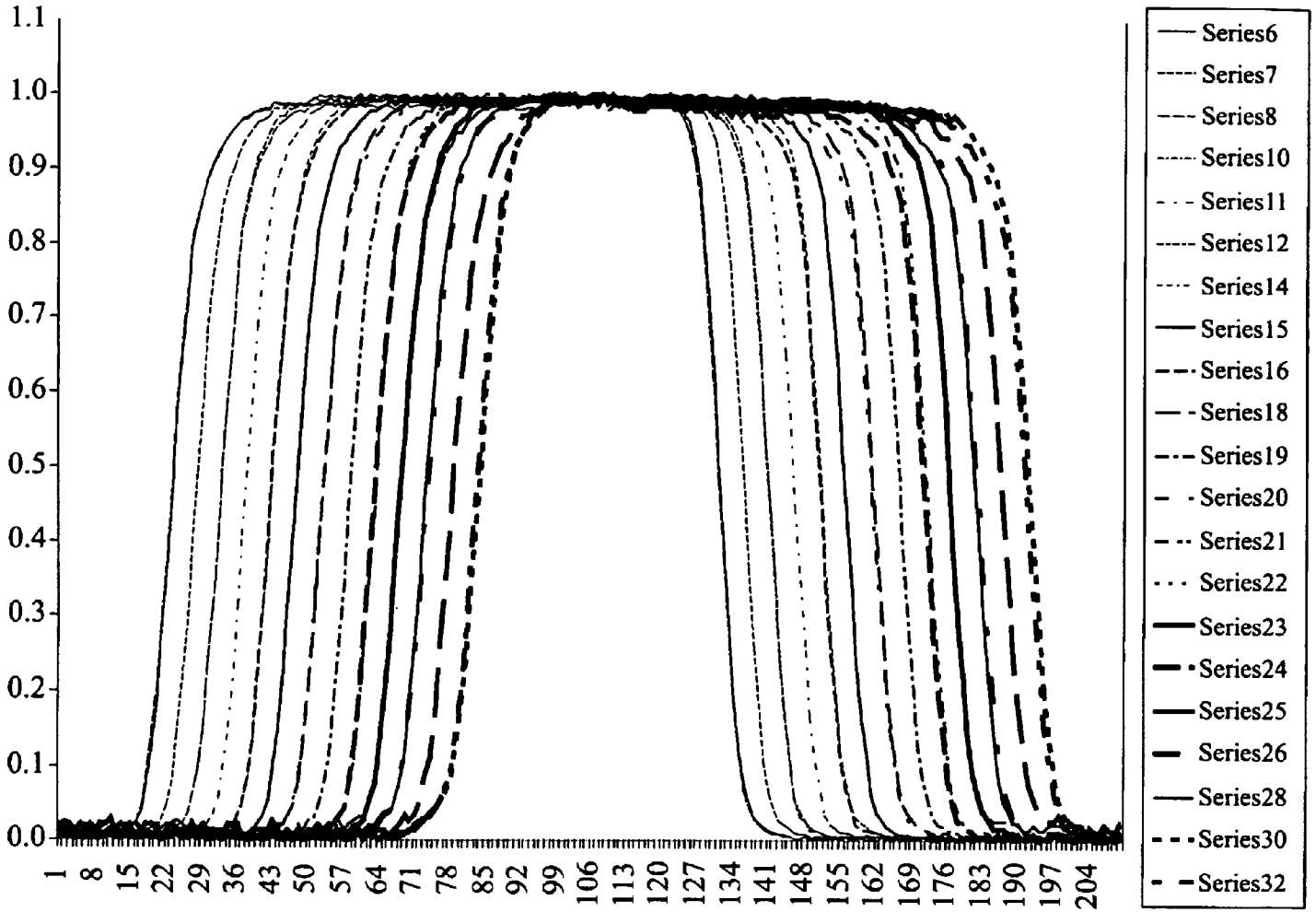
FIG. 13 is graphical illustration of a measured response of several of the object position sensors shown in FIG. 12 as an object passes by those object position sensors of this invention.

FIG. 13 is a graphical representation of the output of a number of the light energy sensors 1202 as the sheet of paper 11 passes over some of those light energy sensors 1202, such that light energy is reflected back from some of those light emitters to the light energy sensors 1202 as the object passes by. Each of the individual curves 1302 correspond to one of the light energy sensors 1202, respectively, such as, for example, the light energy detectors labeled 1 and 2 in FIG. 12. As can be seen from the graph 1300, the output from the individual light energy sensors 1402 will vary based on the location of the object relative to the array shown in FIG. 12.

For example, as an object passes the light energy sensor 2 of the array 1200, it may simultaneously pass over the light energy sensor 4. Shortly thereafter, the sheet will pass over the light energy sensors 1 and/or 3, and then shortly after that, the object will pass over the light energy sensors 6 and/or 8. As such, the response from these light energy sensors may be fairly uniform but spaced in time. As the object moves past these light energy sensors, such that the object no longer reflects light back to these light energy detectors the response will correspondingly drop off to zero.

In this way, individual responses from each individual light energy sensor 1202 act in concert with one another to provide output data capable of being processed to determine an object's position to a resolution that is higher or finer than the pitch and/or the size of the light energy sensors 1202. From the data shown, the lateral position error from a single light energy sensor 1202 having a diameter of 1 cm, as limited by the noise, is estimated to be about 35 microns RMS. Thus, for a sheet of paper 8½"×11", there would be approximately 100 sensors 1202 partially covered at the edges of the sheet. These 100 sensors 1202 would have noise signals which are relatively uncorrelated. Therefore, the error in determining the position and/or rotation of the rectangular object sheet 11 is expected to be less than 5 microns.

While this invention has been described in conjunction with specific embodiments outlined above, it is evident that many alternatives, modifications and variations will be apparent to those skilled in the art. Accordingly, the preferred embodiments of the invention, as set forth above, are intended to be illustrative, not limited. Various changes may be made without departing from the spirit and scope of the invention.

What is claimed is:

[1. An object sensor usable to sense a position of an object, comprising:

a substrate having a surface;

a plurality of discrete light energy detectors distributed over the surface of a detector portion of the substrate, each discrete light energy detector having a two dimensional detection surface having an area that is a non-negligible percentage of the detector portion, the plurality of light energy detectors arranged in a two-dimensional array such that the detection surfaces of the plurality of light energy detectors substantially fill the detector portion of the substrate; and at least one light source arranged relative to the detector portion of the substrate to illuminate the plurality of discrete light energy detectors in absence of the object.]

[2. The object sensor according to claim 1, further comprising a plurality of local controllers, each local controller connected to a corresponding subset of the plurality of light energy detectors.]

[3. The object sensor according to claim 2, wherein each of the plurality of local controllers is positioned relative to the corresponding subset of the plurality of light energy detectors on the substrate.]

[4. The object sensor according to claim 1, wherein the at least one light source is mounted on a second substrate positioned opposite the light energy detectors.]

[5. The object sensor of claim 4, wherein the at least one light source is located at distance from the plurality of light energy detectors sufficient to effectively collimate the light from the at least one light source relative to the plurality of light energy detectors.]

[6. The object sensor of claim 4, further comprising at least one collimating element located between the at least one light source and the plurality of light energy detectors such that light not blocked by the object to be sensed passes through the at least one collimating element and to the plurality of light energy detectors.]

[7. The object sensor of claim 4, wherein the at least one light source comprises a plurality of light sources.]

[8. The object sensor of claim 7, wherein the plurality of light sources are distributed relative to the plurality of light energy detectors in two dimensions.]

[9. The object sensor according to claim 1, wherein the at least one light source is mounted on the substrate adjacent to the light energy detectors.]

[10. The object sensor of claim 9, wherein the at least one light source comprises a plurality of light sources.]

[11. The object sensor of claim 10, wherein the plurality of light sources are distributed relative to the plurality of light energy detectors in two dimensions.]

[12. The object sensor according to claim 11, wherein at least some of the plurality of light energy detectors and some of the plurality of light sources are arranged in a two-dimensional array.]

[13. The object sensor according to claim 10, further comprising a collimating film positioned adjacent to the plurality of light sources, the collimating film having individual windows corresponding to each light source.]

[14. The object sensor according to claim 1, wherein:

the at least one light source comprises a plurality of light sources;

at least some of each of the plurality of light sources is mounted on the substrate within one of the light energy detectors.]

[15. The object sensor according to claim 14, further comprising a collimating film positioned adjacent to the plurality of light sources, the collimating film having individual windows corresponding to each light source.]

[16. The object sensor of claim 1, further comprising a collimating film positioned over the plurality of light energy detectors.]

[17. The object sensor according to claim 16, further comprising a transmissive plate positioned over the collimating film, the transmissive plate having one side facing to the collimating film and an opposite side forming a surface over which the object may travel.]

[18. The object sensor according to claim 17, wherein the transmissive plate comprises plastic material.]

[19. The object sensor according to claim 1, further comprising a plurality of signal processing circuits, each signal processing circuit connected to a corresponding subset of the plurality of light energy detectors.]

[20. The object sensor according to claim 19, wherein each of the plurality of signal processing circuits is positioned relative to the corresponding subset of the plurality of light energy detectors on the substrate.]

[21. The object sensor according to claim 1, wherein the plurality of light energy detectors are formed by a photoreceptor sheet, each light energy detector comprising a portion of the photoreceptor sheet.]

[22. The object sensor according to claim 21, wherein the photoreceptor sheet is bonded to the substrate using a conducting adhesive.]

[23. The object sensor according to claim 21, further comprising a plurality of windows corresponding to the plurality of light sources, each window extending through the photoreceptor sheet.]

[24. The object sensor according to claim 23, wherein a light shield is disposed around the outer surface of the light source.]

[25. The object sensor of claim 21, further comprising a collimating film positioned over the photoreceptor sheet, wherein each window further extends through the collimating film.]

[26. The object sensor according to claim 1, wherein the light energy detectors are solar cells.]

[27. The object sensor according to claim 1, wherein at least one light source substantially evenly illuminates the plurality of discrete light energy detectors in absence of the object.]

[28. The object sensor of claim 1, wherein the lateral dimensions of the light energy detectors are at least 1 mm in diameter.]

29. A method of detecting at least one of a presence, a position, a size, a shape and an orientation of an object using a plurality of discrete light energy detectors distributed over the surface of a detector portion of the substrate, each discrete light energy detector having a two dimensional detection surface having an area that is a non-negligible percentage of the detector portion, the plurality of light energy detectors arranged in two dimensions such that the detection surfaces the plurality of light energy detectors substantially fill the detector portion of the substrate, the method comprising:

passing an object in proximity to the plurality of discrete light energy detectors;

emitting light energy from a plurality of light sources;

using the object to controllably determine which of the plurality of light energy detectors receive light from the plurality of light sources;

receiving the light energy at at least some of the plurality of light energy detectors based on at least some of the position, the size, the reflectivity of the object, the transmissivity of the object, and/or the orientation of the object;

transmitting a signal from each of the light energy detectors based on an amount of received light energy received at each light energy detector;

determining the at least one of the presence, the position, the size, the shape and the orientation of the object based on the transmitted signals from the light energy detectors.

30. The method of claim 29, further comprising:

emitting light energy from a position opposing the light energy detectors toward the light energy detectors.

31. The method of claim 30, further comprising collimating the emitted light before the emitted light reaches the light energy detectors.

32. The method of claim 22, further comprising emitting light from a plurality of positions opposing the light energy detection toward the light energy detectors.

33. The method of claim 32, further comprising collimating the emitted light before the emitted light reaches the light energy detectors.

34. The method of claim 29, further comprising:

emitting light energy from a position to reflectively scatter from the surface of the object to the light energy detectors.

35. The method of claim 29, further comprising:

emitting light energy from center portions of at least some of the light energy detectors to reflectively scatter from the surface of an object to the light energy detectors.

36. The method of claim 29, wherein the lateral dimensions of the light energy detectors are at least 1 mm in diameter.

*37. An object sensor to determine the position of an object comprising:*

*a plurality of discrete light detectors distributed over a surface, each detector having a two dimensional detection surface;*

*at least one light source arranged relative to the detectors such that the amount of light that reaches each discrete light detector varies according to the position of the object, the output of each discrete light detector in the plurality of discrete light detectors used together to determine the position of the object.*

*38. The object sensor of claim 37 further comprising:*

*a collimating film positioned adjacent to the plurality of light detectors, the collimating film to screen out light that is not scattered in a near vertical direction from the object.*

*39. The object sensor of claim 37 wherein the at least one light source is located on the same side of the object as the plurality of discrete light detectors such that the light detected by the detectors is scattered from the object.*

*40. A method of detecting at least one of a presence, a position, a size, a shape and an orientation of an object using a plurality of discrete light energy detectors distributed over the surface of a detector portion of a substrate, each discrete light energy detector having a two dimensional detection surface having an area that is a non-negligible percentage of the detector portion, the plurality of light energy detectors arranged in two dimensions such that the detection surfaces of the plurality of light energy detectors substantially fill the detector portion of the substrate, the method comprising:*

*passing an object in proximity to the plurality of discrete light energy detectors;*

*emitting light energy from at least one light source;*

*using the object to controllably determine which of the plurality of light energy detectors receives light;*

*receiving the light energy at at least some of the plurality of light energy detectors based on at least some of the position, the size, the reflectivity of the object, the transmissivity of the object, and/or the orientation of the object;*

*transmitting a signal from each of the light energy detectors based on an amount of received light energy received at each light energy detector; and*

*determining the at least one of the presence, the position, the size, the shape and the orientation of the object based on the signals transmitted from the light energy detectors.*

*41. The method of claim 40 wherein the light detected at the light energy detectors is scattered from a surface of the object.*

*42. The method of claim 40 further comprising:*

*collimating the emitted light before the emitted light reaches the light energy detectors.*

*43. The method of claim 40 further comprising:*

*collimating the light before the light reaches the light energy detectors.*

* * * * *